US005817539A

United States Patent [19]

Werner

[11] Patent Number: 5,817,539

[45] Date of Patent: Oct. 6, 1998

[54] PRODUCTION METHOD FOR A MICROMECHANICAL COMPONENT WITH A MOVABLE STRUCTURE

[75] Inventor: Wolfgang Werner, München, Germany

[73] Assignee: Siemens Aktiengesellschaft, Munich, Germany

[21] Appl. No.: 780,489

[22] Filed: Jan. 8, 1997

[30] Foreign Application Priority Data

Jan. 8, 1996 [DE] Germany .......................... 196 00 399.7

[51] Int. Cl.[6] .............................. H01L 21/00; G01P 15/00

[52] U.S. Cl. ........................ 438/50; 73/514.21; 73/514.36

[58] Field of Search .................................. 438/50, 51, 52, 438/53; 73/514.21, 514.36

[56] References Cited

U.S. PATENT DOCUMENTS 5,314,572 5/1994 Core et al. .

5,602,411 2/1997 Zettler .................................. 73/514.21

OTHER PUBLICATIONS

"A Dry–Release Method Based on Polymer Columns for Microstructure Fabrication" (Mastrangelo et al.), IEEE No. 0–7803–0957, Feb. 1993, pp. 77–81.

"Electrostatically driven vacuum–encapsulated polysilicon resonators" (Legtenberg et al.), Elsevier Science S.A., 1994, pp. 57–66.

*Primary Examiner*—Brian Dutton

*Attorney, Agent, or Firm*—Herbert L. Lerner; Laurence A. Greenberg

[57] ABSTRACT

In order to avoid sticking effects before a movable micromechanical structure is laid bare, in a production method for a micromechanical component with a movable structure, the structure is joined to a suitable mount, such as the substrate, through an auxiliary structure, and this auxiliary structure is not removed until after the movable structure is laid bare. This method is compatible with IC production processes for integrated circuits.

6 Claims, 1 Drawing Sheet

PRODUCTION METHOD FOR A MICROMECHANICAL COMPONENT WITH A MOVABLE STRUCTURE

BACKGROUND OF THE INVENTION

Field of the Invention

The invention relates to a production method for a micromechanical component with a movable micromechanical structure.

Micromechanical components with a movable structure have a broad field of application, for instance as engine or force sensors (acceleration or inclination sensors). There is major interest in production methods that are compatible with the manufacture of integrated circuits, especially on a silicon substrate. It is only compatibility of the production methods which allows the integration of micromechanics and triggering and evaluation circuits in Microsystems. That is important as well whenever existing semiconductor manufacturing plants are also intended to be used to produce micromechanical structures.

In the usual production methods, the movable structure is laid bare through the use of an isotropic, usually wet-chemical, removal of a layer surrounding it. The problem then arises that adhesion of the movable parts to what underlies them (so-called sticking) occurs. That effect is caused by forces of adhesion, which are very great in structures with small spacings, typically <1 $\mu$m.

One known solution to that problem provides that after the movable parts have been etched bare, the etchant or a rinsing agent used subsequently (such as water) be replaced by a sublimating chemical. The component is then cooled down, so that the movable structure is surrounded by a thin layer of that chemical, which then sublimates. Suitable chemicals include cyclohexane or dichlorobenzene, for instance. Since the required chemicals are not available in the necessary purity, that process is not compatible with the manufacture of integrated circuits. In particular, it cannot be used to manufacture microsystems.

SUMMARY OF THE INVENTION

It is accordingly an object of the invention to provide a production method for a micromechanical component with a movable structure, which overcomes the hereinafore-mentioned disadvantages of the heretofore-known methods of this general type and in which the sticking effect is avoided.

With the foregoing and other objects in view there is provided, in accordance with the invention, a production method for a micromechanical component having a movable structure on a semiconductor substrate, which comprises producing a movable structure, an intermediate layer and a layer or structure acting as a mount by embedding the movable structure in the intermediate layer and separating the movable structure from the mount with a portion of the intermediate layer; forming an opening in the intermediate layer partly laying bare the movable structure and the mount; applying a photoresist layer to form an auxiliary structure in the opening and to join the movable structure and the mount to one another with the auxiliary structure; structuring the photoresist layer into a mask having an opening in the surroundings of the movable structure for laying bare the movable structure; removing the intermediate layer through the opening in the surroundings of the movable structure in an etching process; and subsequently removing the auxiliary structure in a dry etching process.

The invention is based on the use of an auxiliary structure, with which the movable structure is secured to a layer serving as its mount before it is laid bare. The movable structure is then laid bare, in such a way that an intermediate layer surrounding it is removed isotropically by wet-chemical methods. However, the movable structure still remains joined to the mount through the auxiliary structure. The forces of adhesion that occur during drying are therefore unable to cause sticking of the movable structure, for instance to what underlies it. It is only after that, that the auxiliary structure is removed, so that the movable structure becomes fully movable.

In accordance with a concomitant mode of the invention, the substrate itself or a fixed structure of the micromechanical component, for instance, can be used as the mount. It may be located underneath or above the movable structure or at the same level with it. Upon removal of the intermediate layer, it must remain joined to the substrate and, through the auxiliary structure, to the movable structure.

The auxiliary structure is formed of a material which is not attacked upon removal of the intermediate layer and which can be removed simply at the end of the method. Photoresist is a suitable material for this, for example.

In order to produce the auxiliary structure as needed, an opening is made in the intermediate layer in such a way that the surfaces of the movable structure and the mount are partly laid bare. A photosensitive layer (photoresist) is then applied, which creates the auxiliary structure in the opening so that the auxiliary structure joins the movable structure and the mount. A mask which is produced from the photosensitive layer with the aid of exposure to light and development has mask openings which enable the laying bare of the movable structure. In other words, the intermediate layer is etched through the mask openings.

Only processes that are also used in the production of integrated circuits are employed in the method, so that the required compatibility exists.

Other features which are considered as characteristic for the invention are set forth in the appended claims.

Although the invention is illustrated and described herein as embodied in a production method for a micromechanical component with a movable structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
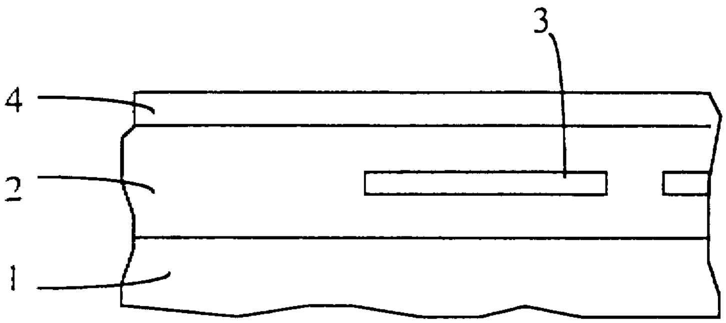
FIGS. 1–4 are fragmentary, diagrammatic, cross-sectional views of a semiconductor substrate having a micromechanical component, in terms of which the method steps will be described.

Referring now to the figures of the drawings in detail and first, particularly, to FIG. 1 thereof, there is seen a starting point of a production method, which is a silicon substrate 1 on which an intermediate layer 2 and a movable structure 3 are applied. The intermediate layer 2 is, for instance, made of silicon dioxide and may include identical or different partial layers. The intermediate layer 2 completely surrounds the movable structure 3 which is to be laid bare later and which, for instance, is formed of polysilicon or a metal. The configuration also has an upper layer 4, from which a fixed structure of the micromechanical component is formed, and which may be formed of the same material as the movable structure.

Figure 2:
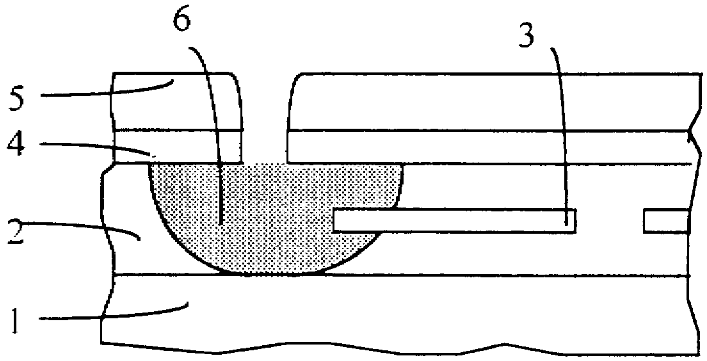

FIG. 2 shows that a photomask 5 is applied, and with it the upper layer 4 and the intermediate layer 2 are etched. In this example, a first etching is effected anisotropically and a second is effected isotropically. However, different etching processes may also be employed. An opening 6 which is formed in the intermediate layer 2 must be dimensioned in such a way that a portion of the movable structure 3 and a portion of a suitable mount are laid bare. In this case, both the substrate 1 and the upper layer 4 are used as a mount.

Figure 3:
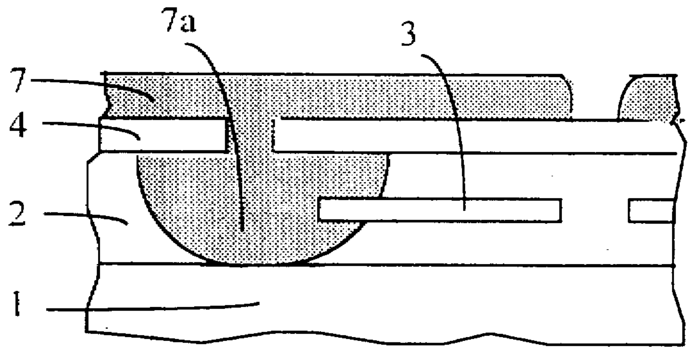

As is seen in FIG. 3, the resist mask 5 is removed and a new photoresist layer 7 is applied, which fills up the opening 6 and in this case forms an auxiliary structure 7*a*. The photoresist layer 7 simultaneously acts as a mask for etching the movable structure 3 until it is bare.

Figure 4:
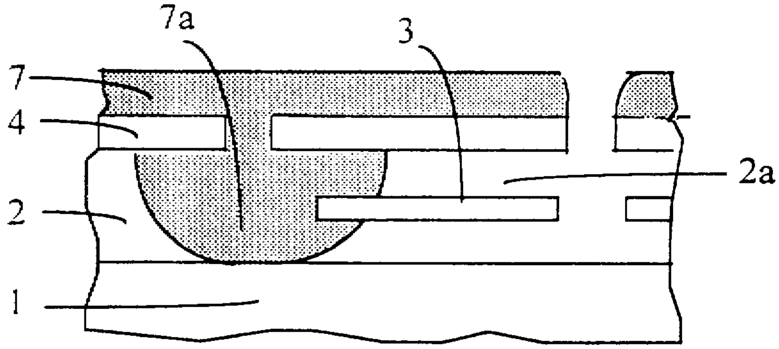

According to FIG. 4, in order to perform this etching bare, the upper layer 4 must be etched first, in this example. Next, the intermediate layer 2 is removed completely around the movable structure 3 through an opening in the photoresist layer 7 in the surroundings 2*a* of the movable structure 3 by a typical isotropic etching process. The movable structure 3 is then joined to the mount, or in other words in this case the movable structure is joined to the substrate 1 and the upper layer 4, through the auxiliary structure 7*a*. The upper layer 4 is solidly joined to the substrate outside the plane of the drawing, for instance through nonremoved parts of the intermediate layer 2. Next, the photoresist layer 7 including the auxiliary structure 7*a* is removed with the aid of an $O_2$ plasma or ozone, so that the movable structure is laid entirely bare.

I claim:

1. A production method for a micromechanical component having a movable structure on a semiconductor substrate, which comprises:

producing a movable structure, an intermediate layer and a mount by embedding the movable structure in the intermediate layer and separating the movable structure from the mount with a portion of the intermediate layer;

forming an opening in the intermediate layer partly laying bare the movable structure and the mount;

applying a photoresist layer to form an auxiliary structure in the opening and to join the movable structure and the mount to one another with the auxiliary structure;

structuring the photoresist layer into a mask having an opening in the surroundings of the movable structure for laying bare the movable structure;

removing the intermediate layer through the opening in the surroundings of the movable structure in an etching process; and subsequently removing the auxiliary structure in a dry etching process.

2. The production method according to claim 1, which comprises forming the mount as a layer.

3. The production method according to claim 1, which comprises forming the mount as a structure.

4. The production method according to claim 1, which comprises forming the mount as a semiconductor substrate.

5. The production method according to claim 1, which comprises forming the mount as fixed structure of the micromechanical component.

6. The production method according to claim 1, which comprises forming the mount as a semiconductor substrate and a fixed structure of the micromechanical component.

* * * * *